(12) United States Patent
Yoon et al.

(10) Patent No.: US 12,030,071 B2
(45) Date of Patent: Jul. 9, 2024

(54) SUBSTRATE TREATING APPARATUS AND LIQUID SUPPLY UNIT

(71) Applicant: SEMES CO., LTD., Chungcheongnam-do (KR)

(72) Inventors: Jungmin Yoon, Daegu (KR); Wan Hee Han, Chungcheongnam-do (KR); Junhyeak Choi, Seoul (KR); Hanseon Kang, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 615 days.

(21) Appl. No.: 17/326,632

(22) Filed: May 21, 2021

(65) Prior Publication Data
US 2021/0362177 A1  Nov. 25, 2021

(30) Foreign Application Priority Data
May 22, 2020 (KR) .................. 10-2020-0061897

(51) Int. Cl.
*B05B 12/00* (2018.01)
*B05B 13/02* (2006.01)
(Continued)

(52) U.S. Cl.
CPC ........ *B05B 12/004* (2013.01); *B05B 13/0228* (2013.01); *B05B 13/0421* (2013.01); *B05B 15/62* (2018.02)

(58) Field of Classification Search
CPC ... B08B 12/004; B08B 15/62; B08B 13/0228; H01L 21/67051; H01L 21/67144
See application file for complete search history.

(56) References Cited

U.S. PATENT DOCUMENTS

| 6,276,378 B1 * | 8/2001 | Taniyama ......... H01L 21/67051 134/902 |
| 7,802,579 B2 * | 9/2010 | Kim .................. H01L 21/67051 134/94.1 |

(Continued)

FOREIGN PATENT DOCUMENTS

| JP | 2007-516099 A | 6/2007 | |
| JP | 2019050295 A * | 3/2019 | ............. H01L 21/02 |

(Continued)

OTHER PUBLICATIONS

Office Action dated Jan. 18, 2023 issued by the Korean Patent Office in corresponding KR Patent Application No. 10-2020-0061897, with English translation.

*Primary Examiner* — Joseph A Greenlund
(74) *Attorney, Agent, or Firm* — Carter, DeLuca & Farrell LLP

(57) ABSTRACT

The inventive concept provides a substrate treating apparatus. According to an embodiment, the substrate treating apparatus may include a liquid supply unit that supplies a treatment liquid onto a to-be-treated surface of the substrate, and the liquid supply unit may include a support shaft spaced apart from the spin chuck by a specific distance, and extending to have a specific length in a direction that is perpendicular to a ground surface, a nozzle support, one end of which is coupled to an upper end of the support shaft, and extending to have a specific length in a direction that is parallel to the ground surface, a nozzle installed at an opposite end of the nozzle support and that supplies the treatment liquid to the substrate, and a motion sensor that detects any one or more of a deflection, a distortion, and a vibration of the liquid supply unit.

16 Claims, 5 Drawing Sheets

(51) Int. Cl.
    *B05B 13/04*     (2006.01)
    *B05B 15/62*     (2018.01)

(56) References Cited

U.S. PATENT DOCUMENTS

| | | | | |
|---|---|---|---|---|
| 10,068,763 | B2* | 9/2018 | Yoshihara | B05C 9/12 |
| 10,289,005 | B2* | 5/2019 | Lee | G03F 7/40 |
| 10,395,930 | B2* | 8/2019 | Um | H01L 21/263 |
| 10,471,457 | B2* | 11/2019 | Yang | B05B 1/14 |
| 10,490,427 | B2* | 11/2019 | Choi | H01L 21/67051 |
| 10,682,674 | B2* | 6/2020 | Jung | H01L 21/6715 |
| 10,818,519 | B2* | 10/2020 | Lee | H01L 21/02052 |
| 11,014,104 | B2* | 5/2021 | Terada | B05B 3/1035 |
| 11,232,942 | B2* | 1/2022 | Yang | H01L 21/67051 |
| 11,361,962 | B2* | 6/2022 | Oh | H01L 21/02282 |
| 11,721,575 | B2* | 8/2023 | Park | B08B 3/04 |
| | | | | 134/153 |
| 11,756,815 | B2* | 9/2023 | Seo | H01L 21/67103 |
| | | | | 73/503.3 |
| 2007/0070097 | A1 | 3/2007 | Bich et al. | |
| 2010/0189887 | A1* | 7/2010 | Nielsen | G01C 15/06 |
| | | | | 427/136 |
| 2013/0319457 | A1* | 12/2013 | Lee | H01L 21/67051 |
| | | | | 134/1 |
| 2019/0035648 | A1* | 1/2019 | Lee | H01L 21/02052 |
| 2019/0314842 | A1* | 10/2019 | Terada | B05B 3/1035 |
| 2019/0314843 | A1* | 10/2019 | Nour-Omid | G05B 19/042 |
| 2021/0362177 | A1* | 11/2021 | Yoon | H01L 21/67288 |
| 2022/0206031 | A1* | 6/2022 | Choi | H01L 21/67253 |

FOREIGN PATENT DOCUMENTS

| | | |
|---|---|---|
| KR | 10-2006-0042973 A | 5/2006 |
| KR | 10-2006-0088974 A | 8/2006 |

* cited by examiner

SUBSTRATE TREATING APPARATUS AND LIQUID SUPPLY UNIT

CROSS-REFERENCE TO RELATED APPLICATIONS

A claim for priority under 35 U.S.C. § 119 is made to Korean Patent Application No. 10-2020-0061897 filed on May 22, 2020, in the Korean Intellectual Property Office, the entire contents of which are hereby incorporated by reference.

BACKGROUND

Embodiments of the inventive concept described herein relate to a substrate treating apparatus and a liquid supply unit.

A process of manufacturing a semiconductor device and a flat panel display panel includes various processes including a photographing process, an etching process, an ashing process, a thin film deposition process, and a cleaning process. During the photographing process, the etching process, the ashing process, and a cleaning process, among the processes, a process of liquid-treating a substrate by supplying a treatment liquid to the substrate is performed.

A substrate treating apparatus that generally liquid-treating a substrate includes a cup that provides an interior space for treating the substrate, a spin chuck provided in the interior space to support the substrate, and a liquid supply unit that supplies the treatment liquid onto the substrate.

In the liquid treating process having the above-mentioned configuration, the treatment liquid is supplied to the rotating substrate W and the supplied treatment liquid contaminates the components of the substrate treating apparatus, for example, when colliding with the cup while spattering to the outside of the substrate W, and thus the apparatus has to be periodically maintained and repaired as the process progresses.

The maintenance/repair operation is performed by inserting a hand of an operator into the apparatus and wiping the apparatus. The operation causes the operator to inevitably collide with the components of the apparatus even though the operator pays attention, and thus the posture of the apparatus is deformed, for example, it is distorted. In particular, the nozzle unit having the cantilever structure is vulnerable to deformation due to the above reason, and it is difficult to recognize the deformation by naked eyes.

SUMMARY

Embodiments of the inventive concept provides a substrate treating apparatus and a liquid supply unit that may prevent a process defect by detecting deformation of the posture of the apparatus, which may occur due to an operator after the apparatus is maintained and repaired.

Embodiments of the inventive concept also provide a substrate treating apparatus and a liquid supply unit that may diagnose a process defect and an abnormal disorder by monitoring vibration data of the liquid supply unit during driving of the apparatus.

Embodiments of the inventive concept also provide a substrate treating apparatus and a liquid supply unit that may standardize the quality of a substrate treated by the substrate treating apparatus.

The aspect of the inventive concept is not limited thereto, and other unmentioned aspects of the present invention may be clearly appreciated by those skilled in the art from the following descriptions.

The inventive concept provides a substrate treating apparatus. According to an embodiment, the substrate treating apparatus may include a cup providing a treatment space to an interior of the substrate treating apparatus, a spin chuck that supports and rotates a substrate in the treatment space, and a liquid supply unit that supplies a treatment liquid onto a to-be-treated surface of the substrate supported by the spin chuck, and the liquid supply unit may include a support shaft spaced apart from the spin chuck by a specific distance, and extending to have a specific length in a direction that is perpendicular to a ground surface, a nozzle support, one end of which is coupled to an upper end of the support shaft, and extending to have a specific length in a direction that is parallel to the ground surface, a nozzle installed at an opposite end of the nozzle support and that supplies the treatment liquid to the substrate, and a motion sensor that detects any one or more of a deflection, a distortion, and a vibration of the liquid supply unit.

According to an embodiment, the motion sensor may monitor any one or more of the deflection, the distortion, and the vibration of the liquid supply unit in a state in which the liquid is supplied by the liquid supply unit.

According to an embodiment, the motion sensor may be a combination of a gyro sensor and an acceleration sensor.

According to an embodiment, the acceleration sensor may be a 3-axis acceleration sensor and the gyro sensor is a 3-axis gyro sensor.

According to an embodiment, the motion sensor may be installed at a location that is adjacent to the nozzle.

According to an embodiment, the treatment liquid may be supplied by the liquid supply unit while the nozzle is moved between a first location and a second location that is different from the first location.

According to an embodiment, the support shaft may be connected to a driver that provides a driving force that rotates the support shaft about a lengthwise direction thereof, the nozzle support may be configured to be rotated about the support shaft as the support shaft is rotated, and the nozzle may be moved as the nozzle support is rotated.

According to an embodiment, the substrate treating apparatus may further include an alarm member that notifies an outside of a necessity for correction of a posture of the liquid supply unit when a deformation of the posture, including the any one or more of a deflection and a distortion of the liquid supply unit detected by the motion sensor deviates from an allowable deformation range.

According to an embodiment, the allowable deformation range may be defined by any one or more of a wavelength, a frequency, and a magnitude of a vibration that constitutes vibration data.

According to an embodiment, the motion sensor may collect vibration data in real time during an operation of the liquid supply unit, and the motion sensor may further include a comparator that compares vibration data according to a type of a cause of an abnormality occurring during the operation of the liquid supply unit with the collected vibration data, and an alarm member that notifies an outside of a cause of an abnormality of the liquid supply unit derived through comparison by the comparator.

The inventive concept provides a liquid supply unit for supplying a treatment liquid onto a to-be-treated surface of a substrate. According to an embodiment, the liquid supply unit may include a support shaft extending to have a specific length in a direction that is perpendicular to a ground surface, a nozzle support, one end of which is coupled to an upper end of the support shaft, and extending to have a specific length in a direction that is parallel to the ground surface, a nozzle installed at an opposite end of the nozzle support and that supplies the treatment liquid to the substrate, and a motion sensor that detects any one or more of a deflection, a distortion, and a vibration of the liquid supply unit.

According to an embodiment, the motion sensor may monitor any one or more of the deflection, the distortion, and the vibration of the liquid supply unit in real time in a state in which the liquid is supplied by the liquid supply unit.

According to an embodiment, the motion senor may be a combination of a gyro sensor and an acceleration sensor.

According to an embodiment, the acceleration sensor may be a 3-axis acceleration sensor and the gyro sensor may be a 3-axis gyro sensor.

According to an embodiment, the motion sensor may be installed at a location that is adjacent to the nozzle.

According to an embodiment, the treatment liquid may be supplied by the liquid supply unit while the nozzle moves between a first location and a second location that is different from the first location.

According to an embodiment, the support shaft may be connected to a driver that provides a driving force that rotates the support shaft about a lengthwise direction thereof, the nozzle support may be configured to be rotated about the support shaft as the support shaft is rotated, and the nozzle may be moved as the nozzle support is rotated.

According to an embodiment, the liquid supply unit may further include an alarm member that notifies an outside of a necessity for correction of a posture of the liquid supply unit when a deformation of the posture, including the any one or more of a deflection and a distortion of the liquid supply unit detected by the motion sensor deviates from an allowable deformation range.

According to an embodiment, the motion sensor may collect vibration data in real time during an operation of the liquid supply unit, and the motion sensor may further include a comparator that compares vibration data according to a type of a cause of an abnormality occurring during the operation of the liquid supply unit with the collected vibration data, and an alarm member that notifies an outside of a cause of an abnormality of the liquid supply unit derived through comparison by the comparator.

According to an embodiment, a substrate treating apparatus may include a cup providing a treatment space to an interior of the substrate treating apparatus, a spin chuck that supports and rotates a substrate in the treatment space, and a liquid supply unit for supplying a treatment liquid onto a to-be-treated surface of the substrate supported by the spin chuck, wherein the liquid supply unit includes a support shaft spaced apart from the spin chuck by a specific distance, and extending to have a specific length in a direction that is perpendicular to a ground surface, a driver coupled to the support shaft at a bottom portion of the support shaft, and which provides a driving force that rotates the support shaft about an axis along a lengthwise direction of the support shaft, a nozzle support, one end of which is coupled to an upper end of the support shaft, extending to have a specific length in a direction that is parallel to the ground surface, and which is rotated about the support shaft as the support shaft is rotated, a nozzle installed at an opposite end of the nozzle support and that supplies the treatment liquid to the substrate, and a motion sensor that detects any one or more of a deflection, a distortion, and a vibration of the liquid supply unit, and wherein the motion sensor is a combination of a 3-axis acceleration sensor and a 3-axis gyro sensor, and is provided at an upper portion of the nozzle.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive may be modified in various forms, and the scope of the inventive concept should not be construed to be limited to the following embodiments. The embodiments of the inventive concept are provided to describe the inventive concept for an ordinary person skilled in the art more completely. Accordingly, the shapes of the components of the drawings are exaggerated to emphasize clearer description thereof.

Figure 1:
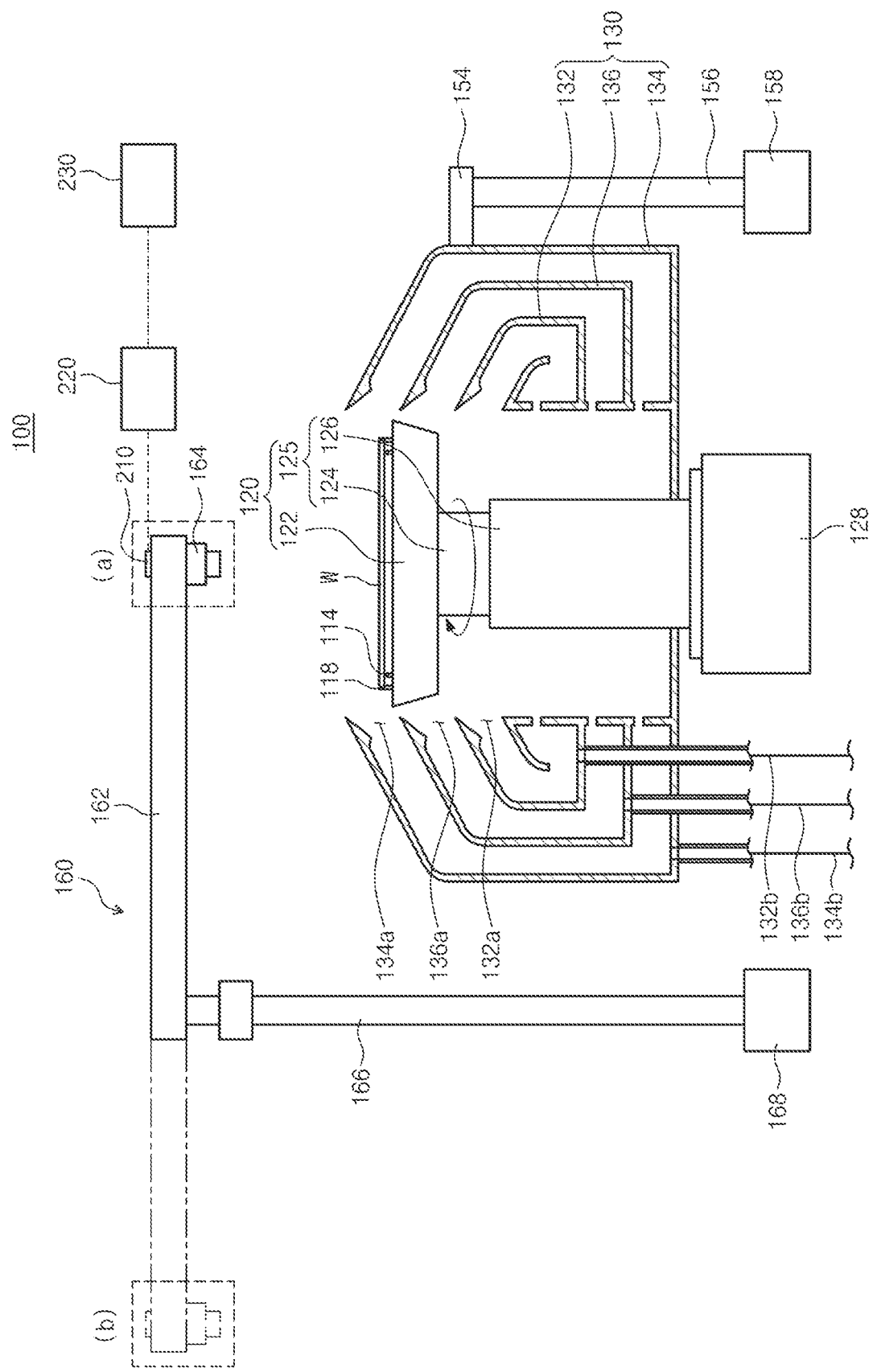
FIG. 1 is a cross-sectional view illustrating a substrate treating apparatus according to an embodiment of the inventive concept.

FIG. 1 is a cross-sectional view schematically illustrating a configuration of a substrate treating apparatus 100 according to an embodiment of the inventive concept.

Referring to FIG. 1, the substrate treating apparatus 100 includes a spin chuck 120, a cup 130, and a liquid supply unit 160.

The spin chuck 120 supports a substrate W in the cup 130. The spin chuck 120 includes a support member 122, on which the substrate W is positioned, and a support shaft 125 that supports a bottom surface of the support member 122.

The support member 122 has a circular upper surface. A plurality of support pins 114 that support the substrate W and a plurality of chuck pins 118 are installed on the upper surface of the support member 122. The support pins 114 are arranged at a peripheral portion of the upper surface of the support member 122 to be spaced apart from each other by a specific interval, and are configured to protrude from the support member 122 to the upper side. The support pin 114 supports a lower surface of the substrate W to space the substrate W apart from the upper surface of the support member 122 upwards. The chuck pins 118 are arranged on the outside of the support pins 114, and are configured to protrude from the support member 122 upwards. The chuck pins 118 are configured to be moved along a radial direction of the support member 122 by a specific distance. The chuck pins 118 arrange the substrate W such that the substrate W supported by the plurality of support pins 114 are positioned at proper locations on the support member 122. Furthermore, the chuck pins 118 support a side part of the substrate W such that the substrate W is prevented from deviating laterally from a proper location thereof during rotation of the substrate W.

The support shaft 125 includes a fixed shaft 126 that is an outer shaft, and a rotary shaft 124 that is an inner shaft. The fixed shaft 126 has a diameter that is larger than the diameter of the rotary shaft 124. The rotary shaft 124 is inserted into the fixed shaft 126 in a cylindrical shape. The rotary shaft 124 is coupled to the support member 122, and a first driver 128 is coupled to the rotary shaft 124. A motor may be used as the first driver 128. As the rotary shaft 124 is rotated, the support member 122 and the substrate W are rotated. An outer surface of the fixed shaft 126 is spaced apart from an outer surface of the rotary shaft 124 and the support member 122, and maintained a fixed state even when the rotary shaft 124 is rotated.

The cup 130 provides a treatment space, in which the substrate W may be treated. The cup 130 includes a space, an upper side of which is opened and in which the substrate W is treated, in the interior thereof. The cup 130 has a structure for separating and recovering treatment liquids used for a process by allowing the treatment liquids to be reused. The cup 130 has a first recovery vessel 132, a second recovery vessel 134, and a third recovery vessel 136, and the recovery vessels 132, 134, and 136 recover different kinds of treatment liquids, among the treatment liquids used in the process.

The first recovery vessel 132 has an annular shape that surrounds the spin chuck 120, and has a first inlet 132*a*. The second recovery vessel 134 has an annular shape that surrounds the first recovery vessel 132, and has a second inlet 134*a*. The third recovery vessel 136 is located between the first recovery vessel 132 and the second recovery vessel 134, has an annular shape that surrounds the first recovery vessel 132, and has a third inlet 136*a*.

The first to third inlets 132*a* to 136*a* communicate with the space in the cup 130, respectively. The inlets 132*a*, 134*a*, and 136*a* are provided at a circumference of the spin chuck 120 to have a ring shape. The inlets 132*a*, 134*a*, and 136*a* of the first recovery vessel 132, the third recovery vessel 136, and the second recovery vessel 134 have different heights. The second inlet 134*a* is provided on the vertically upper side of the third inlet 136*a*, and the third inlet 136*a* is provided on the vertically upper side of the first inlet 132*a*. The treatment liquids ejected to the substrate W and used in the process are introduced into the recovery vessels 132, 134, and 136 through the inlets 132*a*, 134*a*, and 136*a* located at heights corresponding to the substrate W by a centrifugal force due to rotation of the substrate W.

Each of the recovery vessels 132, 134, and 136 has a ring-shaped outer wall, a bottom wall, and an inner wall. The outer wall includes an inclined wall inclined downwardly in a direction that is far from the spin chuck 120, and a vertical wall extending vertically downwards from a lower end thereof. The bottom wall extends horizontally in a direction that faces the spin chuck 120 from a lower end of the vertical wall. The inner wall extends vertically upwards from an end of the inside of the bottom wall. An upper end of the inner wall extends to a location that is spaced apart from an upper end of the inclined wall by a specific distance. The vertically spaced space between the inner wall and the inclined wall functions as the inlets of the recovery vessels 132, 134, and 136, which have been described above.

Recovery lines 132*b*, 134*b*, and 136*b* extending vertically from the recovery vessels 132, 134, and 136 in the downward direction of the bottom surfaces thereof are connected to the recovery vessels 132, 134, and 136, respectively. The recovery lines 132*b*, 134*b*, and 136*b* discharge the treatment liquid introduced through the recovery vessels 132, 134, and 136. The discharged treatment liquid may be reused through an external treatment liquid recycling system (not illustrated).

A second driver 158 is connected to the outside of the cup 130, and adjusts a relative height between the cup 130 and the spin chuck 120. For example, the second driver 158 may be configured to move the cup 130 upwards and downwards. For example, when the substrate W is treated by the first treatment liquid, the cup 130 is moved so that the substrate W on the spin chuck 120 is situated at a height corresponding to the first inlet 132*a*. When the substrate W is treated by the second treatment liquid, the cup 130 is moved so that the substrate W on the spin chuck 120 is situated at a height corresponding to the second inlet 134*a*. The driver 158 is coupled to a movement shaft 156. One end of the movement shaft 156 is coupled to an upper surface of the driver 158. A bracket 154 is fixedly installed on an outer wall of the cup 130 and is fixedly installed at an opposite end of the movement shaft 156.

Figure 2:
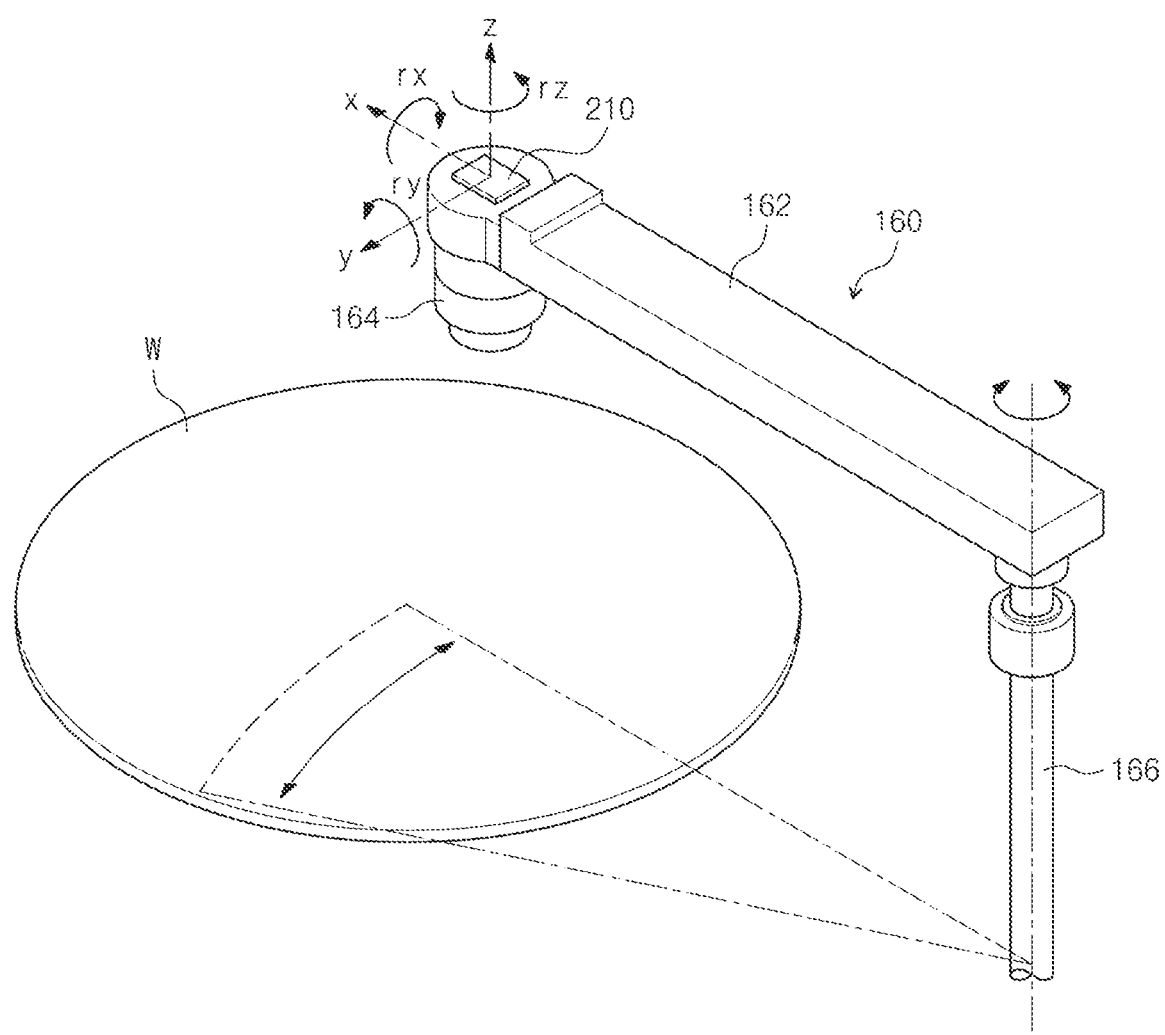
FIG. 2 is a view schematically illustrating a perspective view of a liquid supply unit according to an embodiment of the inventive concept.

The liquid supply unit 160 supplies the treatment liquid toward the substrate W. According to an embodiment, the treatment liquid is phosphoric acid, deionized water (DIW), sulfuric acid ($H_2SO_4$), hydrogen peroxide ($H_2O_2$), SC1, IPA, or a combination thereof, and a functional chemical used to treat the substrate. The liquid supply unit 160 according to the embodiment of the inventive concept will be described further with reference to FIG. 2 together with FIG. 1.

The liquid supply unit 160 supplies the corresponding treatment liquid to the substrate W in the respective operations. The liquid supply unit 160 includes a support shaft 166, a third driver 168, a nozzle support 162, a nozzle 164, and a motion sensor 210.

The support shaft 166 extends to have a specific length in a direction that is perpendicular to a ground surface, and have an upward/downward length. The support shaft 166 is situated to be spaced apart from the spin chuck 120. A lower end of the support shaft 166 is connected to the third driver 168. The third driver 168 rotates the support shaft 166 about an axis along a lengthwise direction of the support shaft 166, or elevates the support shaft 166 along an upward/downward direction.

The nozzle support 162 is vertically connected to an upper end of the support shaft 166 on a side that is opposite to an end thereof, at which the nozzle 164 is installed. The nozzle support 162 has a bar shape, and has a shape extending in a direction that is parallel to the ground surface. The nozzle support 162 may be rotated about the support shaft 166 as the support shaft 166 is rotated.

The nozzle 164 is installed on the bottom surface of an end of the nozzle support 162. The nozzle 164 is moved between a process location (a) and a standby location (b) by the third driver 168. The process location (a) is a location at which the nozzle 164 is arranged at a vertically upper portion of the cup 130, and the standby location (b) is a location that deviates from the vertically upper portion of the cup 130.

When the treatment liquid is supplied to the substrate, the liquid supply unit 160 supplies the treatment liquid to the substrate while the nozzle 164 is swung between a first location and a second location that is different from the first location. The first location may correspond to an area corresponding to a center of the substrate, and the second location may correspond to an area corresponding to a periphery of the substrate.

The motion sensor 210 detects a deformation and a vibration of the posture of the liquid supply unit 160. In more detail, the deformation of the posture includes a deflection and a distortion of the liquid supply unit. The motion sensor 210 is a combination of a gyro sensor and an acceleration sensor. The acceleration sensor may be a 3-axis acceleration sensor and the gyro sensor may be a 3-axis gyro sensor, but an acceleration sensor or a gyro sensor that has a different sensing range may be selected if necessary. The motion sensor 210 is a 6-axis sensor that senses deformations of an x axis location, a y axis location, a z axis location, a rotational angle rx for the x axis, a rotational angle ry for the y axis, and a rotational angle rz for the z axis. The motion sensor 210 may collect vibration data, and the vibration data may be defined from any one or more of the wavelength, the frequency, and the magnitude of the vibration.

The motion sensor 210 is installed to be located adjacent to the nozzle 164. In detail, an example of installing the motion sensor 210 adjacent to the nozzle may correspond to an upper portion of the nozzle 164. Furthermore, in an example of installing the motion sensor 210 adjacent to another nozzle, because the nozzle 164 corresponds to a free end of the nozzle support 162 that is the nozzle support 162 of a cantilever structure, the location adjacent to the nozzle may correspond to the free end of the nozzle support 162. However, the location of the motion sensor 210 is not limited thereto, and any location, at which the motion sensor 210 may easily observe the deformation and the vibration of the posture of the liquid supply unit 160, is sufficient.

The substrate treating apparatus according to the embodiment of the inventive concept further includes a comparator 220 and an alarm member 230.

The comparator 220 compares a sensing value measured by the motion sensor 210 with a reference value, or determines whether the sensing value exceeds an allowable range. The comparator 220 may compare a deflection, a distortion, or vibration data according to the types of causes of abnormalities that may occur during an operation of the liquid supply unit 160, which are preset and stored in advance, with the deflection, the distortion, or the vibration data of the liquid supply unit 160 collected by the motion sensor 210. Furthermore, the comparator 220 may store an allowable deformation range of the deformation of the posture of the liquid supply unit 160, including any one or more of the deflection, the distortion, and the vibration of the liquid supply unit 160, and may determine whether the sensing value exceeds the allowable deformation range after comparing the allowable deformation range with the sensing value measured by the motion sensor 210. Meanwhile, the allowable range for the vibration stored in the comparator 220 may be defined from any one or more of the wavelength, the frequency, and the magnitude of the vibration.

The alarm member 230 provides an alarm to the outside of the apparatus. The alarm member 230 may be configured to provide a warning expression to a monitor for managing the apparatus, provide an alarm sound, or flickering an alarm lamp.

The motion sensor 210 monitors any one or more of the deflection, the distortion, and the vibration of the liquid supply unit 160 in real time while the liquid is supplied by the liquid supply unit 160.

Figure 3:
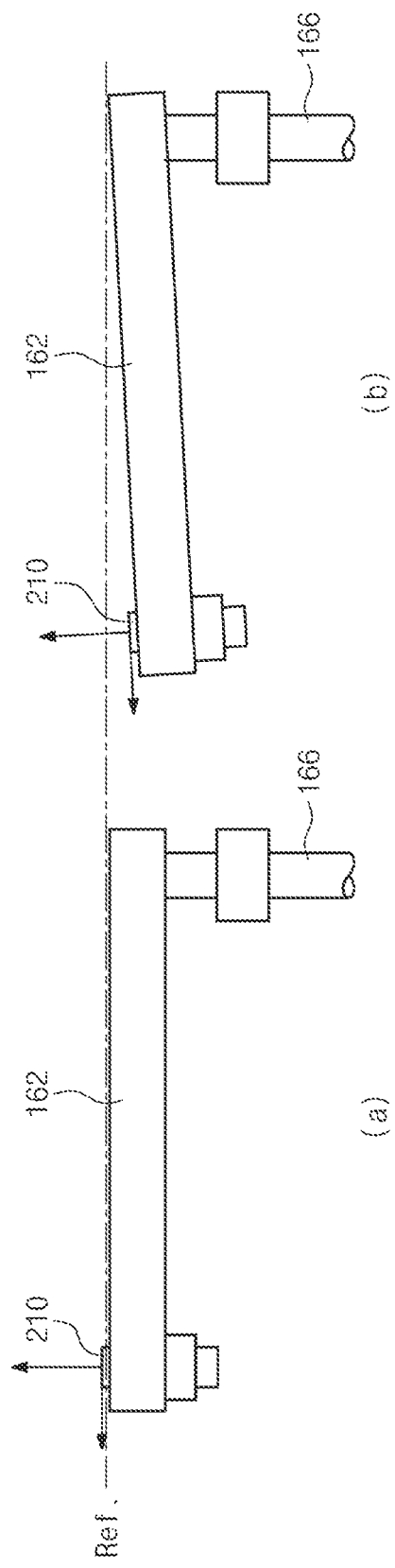
FIG. 3 is a view illustrating a deflection measured by a motion sensor 210 according to an embodiment of the inventive concept.

FIG. 3 is a view illustrating a deflection measured by the motion sensor 210 according to an embodiment of the inventive concept.

Referring to FIG. 3, FIG. 3A illustrates a normal state and illustrates a situation, in which the nozzle support 162 is in a reference posture at a reference location (Ref). FIG. 3B illustrates a state in which a deflection that is a deformation of the posture of the liquid supply unit 160 occurs and illustrates a state, in which the free end of the nozzle support 162 of the liquid supply unit 160 having the cantilever structure is deflected in the gravitational direction.

Figure 4:
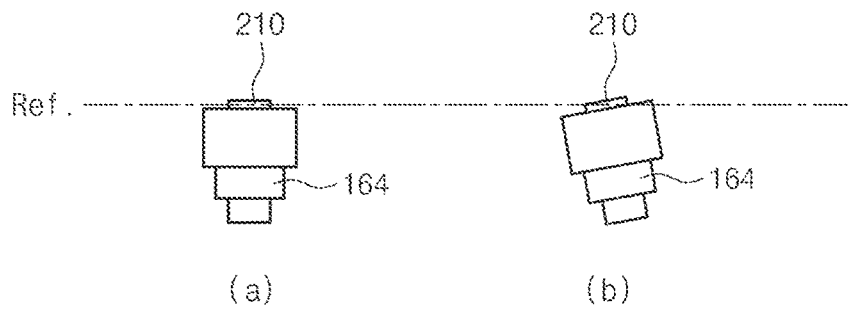
FIG. 4 is a view illustrating a distortion measured by a motion sensor 210 according to an embodiment of the inventive concept.

FIG. 4 is a view illustrating a distortion measured by the motion sensor 210 according to an embodiment of the inventive concept.

Referring to FIG. 4, FIG. 4A illustrates a normal state and illustrates a situation, in which the nozzle support 162 is in a reference posture at a reference location (Ref.). FIG. 4B illustrates a state, in which a distortion that is a deformation of the posture of the liquid supply unit 160 occurs, and illustrates a state in which the nozzle support 162 is distorted in the counterclockwise direction.

The deflection of FIG. 3 may occur due to the gravitational force and the distortion of FIG. 4 may occur due to a change in temperature, but they may occur due to a maintenance operation of an operator. The apparatus is maintained and repaired by inserting a hand of the operator into the interior of the apparatus and wiping the apparatus, and the operation causes a deformation, such as distortion of the posture of the apparatus while the operator inevitably collides with the components of the apparatus even though the operator pays attention. In particular, the nozzle unit having the cantilever structure is vulnerable to deformation due to the above reason, and it is difficult to recognize the deformation by naked eyes. Meanwhile, when the motion sensor 210 is used according to the embodiment of the inventive concept, the deformation of the posture may be measured sensitively.

Figure 5:
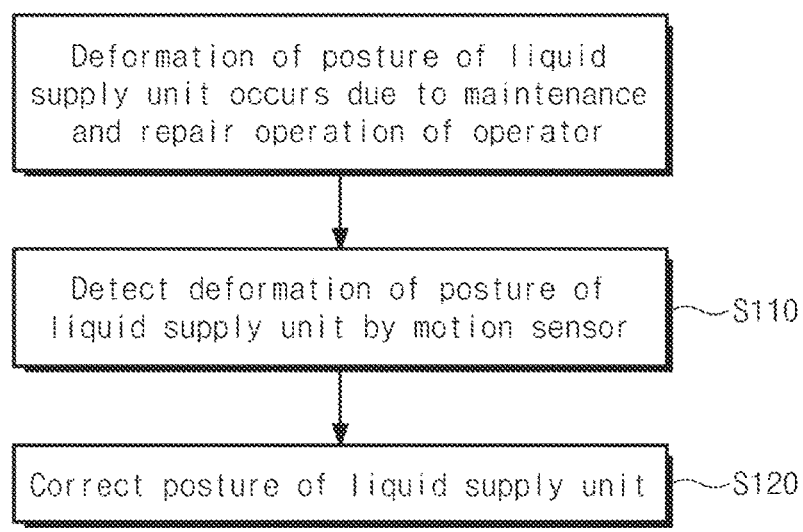
FIG. 5 is a flowchart illustrating a posture correcting method of an operation method of a substrate treating apparatus according to an embodiment of the inventive concept.

FIG. 5 is a flowchart illustrating a posture correcting method of an operation method of a substrate treating apparatus according to an embodiment of the inventive concept. Referring to FIG. 5, when the posture of the liquid supply unit 160 is deformed due to the maintenance and repair of the operator, the motion sensor 210 detects the deformation of the posture of the liquid supply unit 160 (S110; a posture deformation detecting operation). The motion sensor 210 may derive a deformation value (for example, a value obtained by subtracting a coordinate of a deformation location from a coordinate of the reference location) due to a fine deformation, but the fine deformation may be ignored unless it is determined that the fine deformation may influence the process. When the detected deformation may influence the process, the alarm member 230 notifies the outside of the generation of the deformation and the necessity of the correction of the posture. It may be determined whether the deformation corresponds to a level that may influence the process, by the comparator 220. The notified operator corrects the posture of the liquid supply unit 160 based on the value measured by the motion sensor 210 in the posture deformation detecting operation (S110) (S120; a posture correcting operation).

Figure 6:
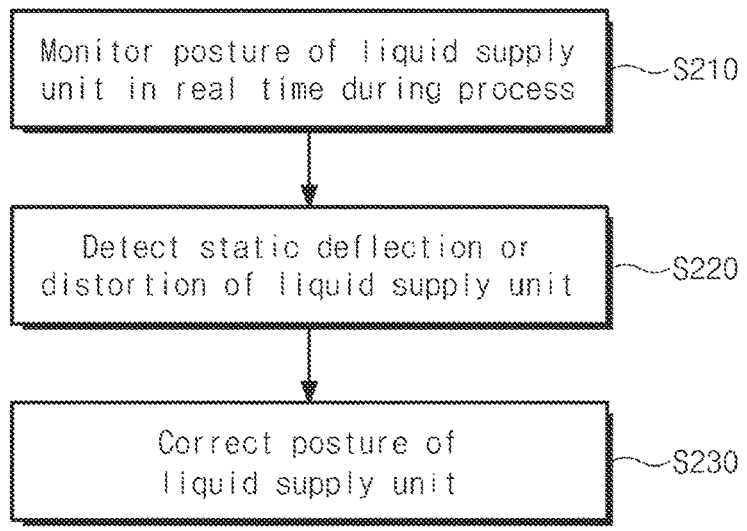
FIG. 6 is a flowchart illustrating a posture correcting method of an operation method of a substrate treating apparatus according to another embodiment of the inventive concept.

FIG. 6 is a flowchart illustrating a posture correcting method of an operation method of a substrate treating apparatus according to another embodiment of the inventive concept. Referring to FIG. 6, the posture correcting method includes an operation of monitoring the posture of the liquid supply unit 160 in real time during the process of supplying the treatment liquid to the substrate and treating the substrate by the liquid supply unit 160 (S210). The liquid supply unit 160 may be heated and distorted by the temperature of the treatment liquid provided to the substrate treating process, or may be deflected due to the gravitational force, and as the nozzle 164 is swung between the first location and the second location in the substrate treating process, different deflections or distortions may occur at the respective locations due to the swinging. The motion sensor 210 collects information by monitoring the deformation of the posture of the liquid supply unit 160 in real time. When the deformation of the posture of the liquid supply unit 160 is detected (S220), the alarm member 230 notifies the outside of the generation of the deformation and the necessity of the correction of the posture. Meanwhile, unless the deformation of the posture is merely a fine deformation and is a level that does not influence the process, it may be ignored. It may be determined whether the deformation corresponds to a level that may influence the process and exceeds the allowable range, by the comparator 220.

Figure 7:
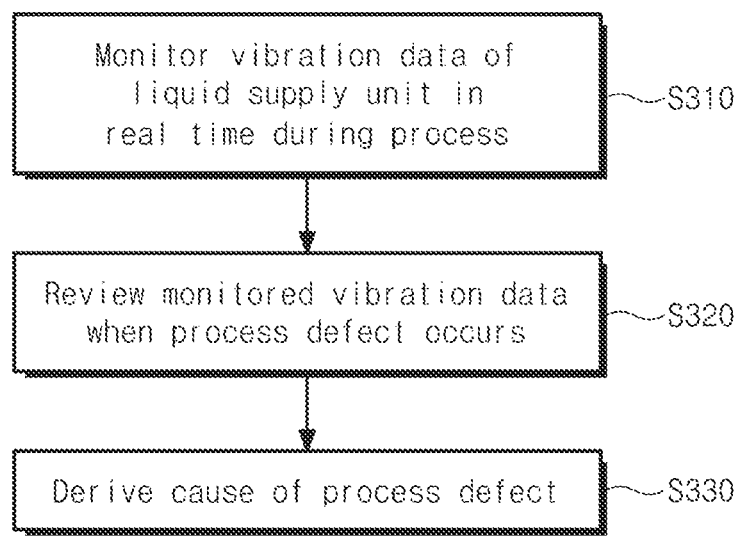
FIG. 7 is a flowchart illustrating a process defect cause deriving method of an operation method of a substrate treating apparatus according to an embodiment of the inventive concept.

FIG. 7 is a flowchart illustrating a process defect cause deriving method of an operation method of a substrate treating apparatus according to an embodiment of the inventive concept. Referring to FIG. 7, the process defect cause deriving method includes an operation of monitoring the posture of the liquid supply unit 160 in real time during the process of supplying the treatment liquid to the substrate and treating the substrate by the liquid supply unit 160, and an operation of collecting vibration data of the liquid supply unit 160 (S310). The liquid supply unit 160 may vibrate due to a mechanical configuration of the liquid supply unit 160 and supply of the treatment liquid. For example, the third driver 168 of the liquid supply unit 160 may include a driving motor, a timing belt, and a pulley, and the vibration of the liquid supply unit 160 may be changed to abnormal vibration, for example, due to loosening of the timing belt or a change in the strength of the timing belt. In particular, an abnormal vibration may significantly occur particularly in an acceleration/deceleration zone due to a swinging motion during driving of the liquid supply unit 160. When a process defect occurs, the vibration data collected by the motion sensor 210 are reviewed (S320). A cause of the process defect is derived by comparing the vibration data corresponding to the process defect collected by the motion sensor 210 with the stored vibration data according to the types of the causes of the abnormalities, which may occur during the operation of the liquid supply unit 160 (S330).

Figure 8:
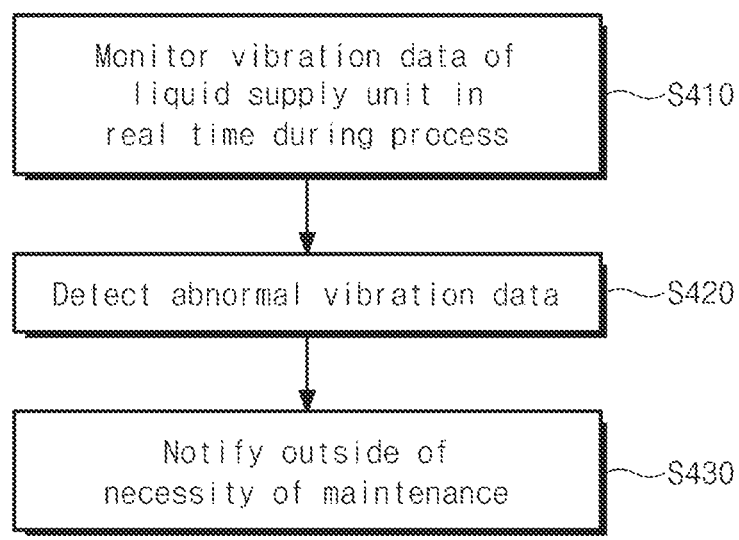
FIG. 8 is a flowchart illustrating a process monitoring method of an operation method of a substrate treating apparatus according to an embodiment of the inventive concept.

FIG. 8 is a flowchart illustrating a process monitoring method of an operation method of a substrate treating apparatus according to an embodiment of the inventive concept. Referring to FIG. 8, the process monitoring method includes an operation of monitoring the posture of the liquid supply unit 160 in real time during the process of supplying the treatment liquid to the substrate and treating the substrate by the liquid supply unit 160, and an operation of collecting vibration data of the liquid supply unit 160 (S410). The comparator 220 detects occurrence of abnormal vibration data from the vibration data collected in real time (S420). When the abnormal vibration data are detected, the alarm member 230 notifies the outside of the necessity of the maintenance of the liquid supply unit 160 (S430). The comparator 220 may compare the vibration data collected in real time by the motion sensor 210 with the vibration data according to the types of the causes of the abnormalities, and may inform the outside of a configuration that is the cause of the abnormal vibration and thus needs to be maintained.

It has been described in the above-mentioned example that the cup 130 includes three recovery vessels. However, the cup 130 may have one, two, or four or more recovery vessels.

It has been described in the above-mentioned example that the nozzle may be moved as the support shaft is rotated in the liquid supply apparatus. However, unlike this, the location of the nozzle may be moved as the support shaft is connected to a linear motor and the support shaft is linearly moved through an operation of the linear motor.

According to the embodiment of the inventive concept, a process defect may be prevented by detecting deformation of the posture of the apparatus, which may occur due to an operator after the apparatus is maintained and repaired.

According to the embodiment of the inventive concept, a process defect and an abnormal disorder may be diagnosed by monitoring vibration data of the liquid supply unit during driving of the apparatus.

According to the embodiment of the inventive concept, the quality of a substrate treated by the substrate treating apparatus may be standardized.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
   a cup providing a treatment space to an interior of the substrate treating apparatus;
   a spin chuck configured to support and rotate a substrate in the treatment space; and
   a liquid supply unit configured to supply a treatment liquid onto a to-be-treated surface of the substrate supported by the spin chuck,
   wherein the liquid supply unit includes:
      a support shaft spaced apart from the spin chuck by a specific distance, and extending to have a specific length in a direction that is perpendicular to a ground surface;
      a nozzle support, including a first end of which is coupled to an upper end of the support shaft, the nozzle support extending to have a specific length in a direction that is parallel to the ground surface;

a nozzle installed at a second end of the nozzle support, the second end located at an opposite end of the nozzle support and configured to supply the treatment liquid to the substrate; and a motion sensor configured to detect any one or more of a deflection, a distortion, and a vibration of the liquid supply unit, wherein the motion sensor is installed at the second end of the nozzle support at a location that is adjacent to the nozzle, wherein the motion sensor collects vibration data in real time during an operation of the liquid supply unit, and wherein the motion sensor further includes:
a comparator configured to compare vibration data according to a type of a cause of an abnormality occurring during the operation of the liquid supply unit with the collected vibration data; and
an alarm member configured to notify an outside of a cause of an abnormality of the liquid supply unit derived through comparison by the comparator.

2. The substrate treating apparatus of claim 1, wherein the motion sensor monitors any one or more of the deflection, the distortion, and the vibration of the liquid supply unit in a state in which the liquid is supplied by the liquid supply unit.

3. The substrate treating apparatus of claim 1, wherein the motion sensor is a combination of a gyro sensor and an acceleration sensor.

4. The substrate treating apparatus of claim 3, wherein the acceleration sensor is a 3-axis acceleration sensor and the gyro sensor is a 3-axis gyro sensor.

5. The substrate treating apparatus of claim 1, wherein the treatment liquid is supplied by the liquid supply unit while the nozzle is moved between a first location and a second location that is different from the first location.

6. The substrate treating apparatus of claim 5, wherein the support shaft is connected to a driver configured to provide a driving force that rotates the support shaft about a lengthwise direction thereof,
wherein the nozzle support is configured to be rotated about the support shaft as the support shaft is rotated, and
wherein the nozzle is moved as the nozzle support is rotated.

7. The substrate treating apparatus of claim 1, further comprising:
an alarm member configured to notify an outside of a necessity for correction of a posture of the liquid supply unit when a deformation of the posture, including the any one or more of the deflection and the distortion of the liquid supply unit detected by the motion sensor deviates from an allowable deformation range.

8. The substrate treating apparatus of claim 7, wherein the allowable deformation range is defined by any one or more of a wavelength, a frequency, and a magnitude of a vibration that constitutes vibration data.

9. A liquid supply unit for supplying a treatment liquid onto a to-be-treated surface of a substrate, the liquid supply unit comprising:
a support shaft extending to have a specific length in a direction that is perpendicular to a ground surface;
a nozzle support, including a first end of which is coupled to an upper end of the support shaft, the nozzle support extending to have a specific length in a direction that is parallel to the ground surface;
a nozzle installed at a second end of the nozzle support, the second end located at an opposite end of the nozzle support and configured to supply the treatment liquid to the substrate; and
a motion sensor configured to detect any one or more of a deflection, a distortion, and a vibration of the liquid supply unit,
wherein the motion sensor is installed at the second end of the nozzle support at a location that is adjacent to the nozzle,
wherein the motion sensor collects vibration data in real time during an operation of the liquid supply unit, and
wherein the motion sensor further includes:
a comparator configured to compare vibration data according to a type of a cause of an abnormality occurring during the operation of the liquid supply unit with the collected vibration data; and
an alarm member configured to notify an outside of a cause of an abnormality of the liquid supply unit derived through comparison by the comparator.

10. The liquid supply unit of claim 9, wherein the motion sensor monitors any one or more of the deflection, the distortion, and the vibration of the liquid supply unit in real time in a state in which the liquid is supplied by the liquid supply unit.

11. The liquid supply unit of claim 9, wherein the motion sensor is a combination of a gyro sensor and an acceleration sensor.

12. The liquid supply unit of claim 11, wherein the acceleration sensor is a 3-axis acceleration sensor and the gyro sensor is a 3-axis gyro sensor.

13. The liquid supply unit of claim 9, wherein the treatment liquid is supplied by the liquid supply unit while the nozzle moves between a first location and a second location that is different from the first location.

14. The liquid supply unit of claim 13, wherein the support shaft is connected to a driver configured to provide a driving force that rotates the support shaft about a lengthwise direction thereof,
wherein the nozzle support is configured to be rotated about the support shaft as the support shaft is rotated; and
wherein the nozzle is moved as the nozzle support is rotated.

15. The liquid supply unit of claim 9, further comprising:
an alarm member configured to notify an outside a user of a necessity for correction of a posture of the liquid supply unit when a deformation of the posture, including the any one or more of the deflection and the distortion of the liquid supply unit detected by the motion sensor deviates from an allowable deformation range.

16. A substrate treating apparatus comprising:
a cup providing a treatment space to an interior of the substrate treating apparatus;
a spin chuck configured to support and rotate a substrate in the treatment space; and
a liquid supply unit for supplying a treatment liquid onto a to-be-treated surface of the substrate supported by the spin chuck,
wherein the liquid supply unit includes:
a support shaft spaced apart from the spin chuck by a specific distance, and extending to have a specific length in a direction that is perpendicular to a ground surface;
a driver coupled to the support shaft at a bottom portion of the support shaft, and configured to provide a driving force that rotates the support shaft about an axis along a lengthwise direction of the support shaft;

a nozzle support, including a first end of which is coupled to an upper end of the support shaft, the nozzle support extending to have a specific length in a direction that is parallel to the ground surface, and configured to be rotated about the support shaft as the support shaft is rotated;

a nozzle installed at a second end of the nozzle support, the second end located at an opposite end of the nozzle support and configured to supply the treatment liquid to the substrate; and a motion sensor configured to detect any one or more of a deflection, a distortion, and a vibration of the liquid supply unit, and wherein the motion sensor is a combination of a 3-axis acceleration sensor and a 3-axis gyro sensor, and is provided at an upper portion of the nozzle, wherein the motion sensor is installed at the second end of the nozzle support at a location that is adjacent to the nozzle, wherein the motion sensor collects vibration data in real time during an operation of the liquid supply unit, and wherein the motion sensor further includes:
- a comparator configured to compare vibration data according to a type of a cause of an abnormality occurring during the operation of the liquid supply unit with the collected vibration data; and
- an alarm member configured to notify an outside of a cause of an abnormality of the liquid supply unit derived through comparison by the comparator.

* * * * *